(12) United States Patent
Logue

(10) Patent No.: US 6,229,305 B1
(45) Date of Patent: *May 8, 2001

(54) METHOD OF INCREASING FLUX HELICITY IN A POLAR SENSOR BY MEANS OF STACKED DRIVING TOROIDS

(76) Inventor: Delmar L. Logue, R.R. #1, Box 60, Herrick, IL (US) 62431

( * ) Notice: Subject to any disclaimer, the term of this patent is extended or adjusted under 35 U.S.C. 154(b) by 0 days.

This patent is subject to a terminal disclaimer.

(21) Appl. No.: 09/138,750

(22) Filed: Aug. 24, 1998

Related U.S. Application Data

(63) Continuation-in-part of application No. 08/832,100, filed on Apr. 3, 1997, now Pat. No. 5,409,118, and a continuation-in-part of application No. 09/023,516, filed on Feb. 13, 1998, now Pat. No. 5,939,880.

(51) Int. Cl.[7] ............................. G01N 27/72; G01R 33/12
(52) U.S. Cl. ............................. 324/240; 324/232
(58) Field of Search ..................... 324/240, 239, 324/262, 232, 233, 228, 234, 236, 237, 238

(56) References Cited

U.S. PATENT DOCUMENTS 5,939,880 * 8/1999 Logue ................................. 324/232

* cited by examiner

Primary Examiner—Walter E. Snow

(57) ABSTRACT

The passive torsional flux characteristics of polar sensors as related to the effective flux length coupling the pick-up coil are elucidated. A sine-cosine excited toroidal driving core comprising stacked magnetic materials having different permeabilities for enhanced helical induction coupling to the pick-up core. Also an active torsional flux means utilizing stacked driving toroids concentrically coupled to the polar sensor pick-up core. Also, integral sensor/driver embodiment utilizing at least two stacked toroids.

8 Claims, 4 Drawing Sheets

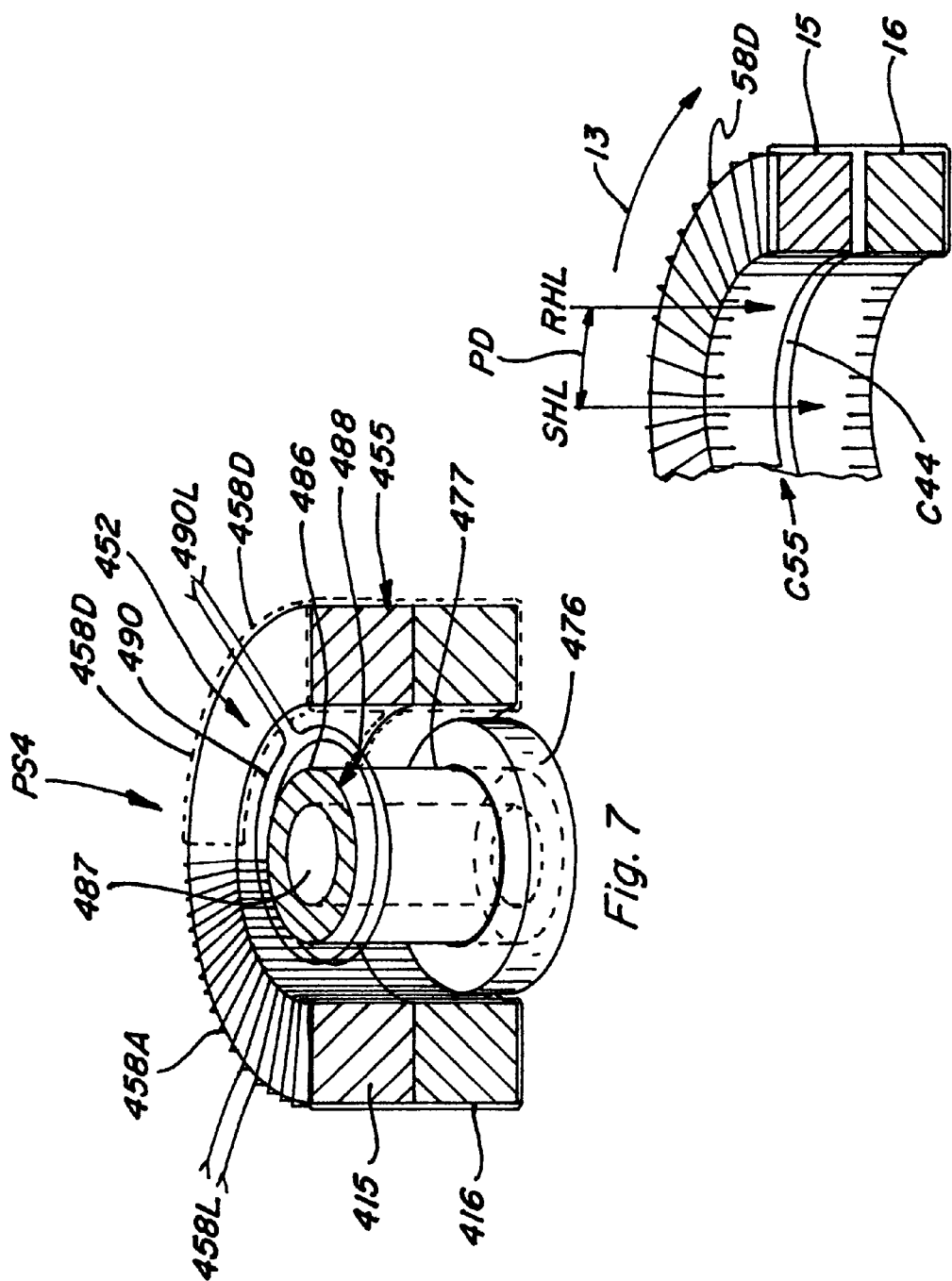

METHOD OF INCREASING FLUX HELICITY IN A POLAR SENSOR BY MEANS OF STACKED DRIVING TOROIDS

This Disclosure is a Continuation-in-part of patent application Ser. Nos. 08/832,100 filed Apr. 3, 1997, now U.S. Pat. No. 5,409,118, and 09/023,516 filed Feb. 13, 1998, now U.S. Pat. No. 5,939,880. The subject invention was originally recorded in Disclosure Document No. 442830 filed Jul. 23, 1998.

BACKGROUND ART

The disclosed polar sensor embodiments utilize rotating magnetic field concepts taken from Tesla Patent Nos. 381, 968 May 1, 1888 382,279 May 1, 1888 382,280 May 1, 1888, 390,414 Oct. 2, 1888 390,721 Oct. 9, 1888.

It has been stated in Logue patent no. 5,754,043 col. 4, lines 39–42, a polar sensor driving core is "similar to poly-phase induction motor stator designs for generating rotating magnetic fields.".

Further it has been stated in the cited copending patent Ser. No. 09/023,516 page 1, last paragraph: "The present invention utilizes rotating field stator structure concepts originating with Tesla e.g. all poly-phase induction motor stator designs".

A dual driving core sensor was disclosed in the cited Logue patent no. 5,754,043 FIGS. 10, 11, col. 5, lines 1–67, and further in col. 6, lines 1–7, which had the capability of generating an "lactive flux helix" in the pick-up core in response to phasing differences between the two interacting driving fields.

SUMMARY OF THE INVENTION

The unique high amplitude low noise signals recorded in copending patent Ser. No. 08/832,100 FIGS. 16–20 are now believed to be generated by a helical magnetic path (a flux helix) inherent in the polar sensor outer pole element 84, 184, 284. The subject helical flux path will be diagrammatically mapped to show a shortened effective flux length coupling the pick-up coil.

A "flux helix" may be induced within the pick-up structure by passive and/or active inductive elements. Firstly, a copper washer concentric around the sensing face (also called the extending portion) of the pick-up core. Secondly, stacking (at least two) driving toroids with a spatially fixed angular phase difference between each. Digital computer synthesis sine-cosine excitation generators further expand the utility of stacked toroid driving cores, providing full phase control of flux helicity, controlling the resultant effective length of the "imbalance flux" coupling the pick-up coil.

BRIEF DESCRIPTION OF THE DRAWINGS

FIG. 7, is an isometric view of an alternate driving/pick-up utilizing the composite toroid driving core of FIG. 1.

FIG. 8, is a fragmentary isometric view of composite toroid C55, magnetic induction B is plotted angularly against the rotating magnetizing field H relative to differing hysteresis loops.

DETAILED DESCRIPTION OF THE INVENTION

Figure 1:
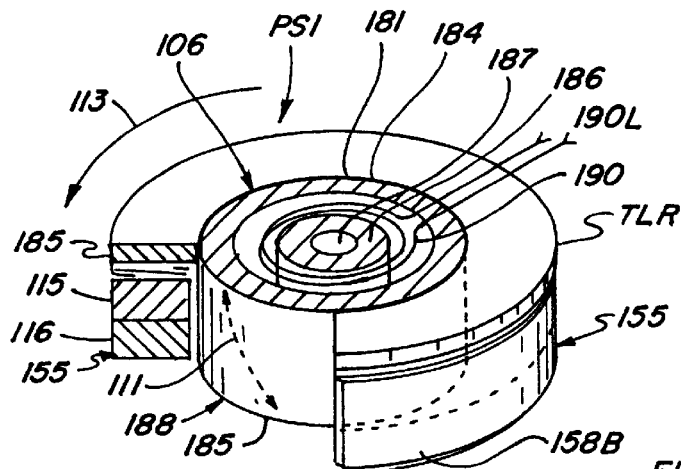
FIG. 1, ia a isometric cut away view of polar sensor PS1, the first embodiment of the invention comprising a pick-up core, a driving core and a thick copper washer TLR (torsional Lenz reflector).

FIG. 1, is an isometric cut away view of polar sensor PS1 (generic construction) comprising a pick-up core 188 formed of a high permeability magnetic material having a cylindrical outer pole 184, a central pole 184 and a base portion 185 (a pot core half without lead slots). The outer pole 84, 184, 284, being the sensing coupler (sole driving flux coupling means to the workpiece). Central pole 86, 186, 286, and the base portion 85, 185, 285 (coupling collar 373, 476 in FIGS. 6, 7) are the imbalance flux return path. There is a pick-up coil 190 of many turns wound around central pole 186 with connection leads 190L. A thick 183 copper washer TLR is concentrically fit (snug) around the extending portion of pick-up core 188. The torsional Lenz reflector TLR acts as a torsional load to the driving flux forming a flux helix 111 in the cylindrical outer pole 184.

Flux helicity may be enhanced by utilizing a driving toroid 155 having a composite cross-section i.e. two toroids formed of different magnetic materials 115, 116, (differing hysteresis loops), bonded together to form a unitary structure.

A degree of helicity is induced in the longitudinal length of outer pole 184 by the said differing hysterisis loops adding to torsional Lenz reflector TLR.

Figure 2:
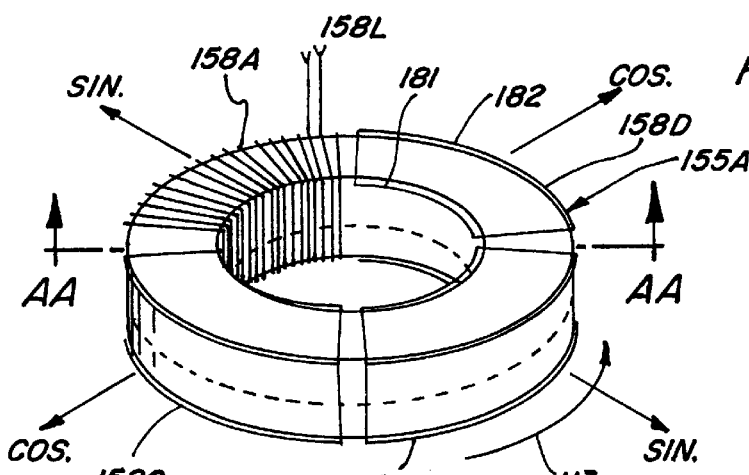
FIGS. 2, 3, are isometric views of the preferred driving core (Tesla motor stator) for the disclosed polar sensors.
Figure 2A:
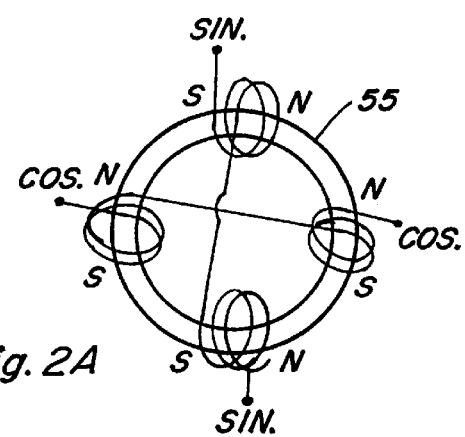
FIG. 2A, is a is schematic diagram of the sine-cosine excitation polarities of the driving cores employed in the invention.

The preferred composite toroids may be obtained from Fair-Rite Products Corp. Wallkill, N.Y. 12589 combining a high permeability 77 material toroid with a high saturation Micro-metals #52 iron powder. FIG. 2 is an isometric view of driving core 155A comprising a toroid core molded of high permeability ferrite (Fair-Rite Products Co. part no. 5977011001). Pick-up coil 190 in FIG. 1, is coplanar driven by driving toroid 155, (155A, 155B). Driving toroid 155, 155A, 155B, is wound with four single layer sine-cosine excitation coils. Single layer excitation windings are shown throughout this disclosure for less coupling coefficient (reduced annular spacing) between the driving toroid 55, 155, and the pick-up core 88, 188, 288, 388. Multi-layer windings may be employed to allow a greater impedance choice, as do series/parallel interconnections. To further reduce the mentioned coupling coefficient and space limitations, wire having square or rectangular cross-section may be utilized to increase magnetizing current density. To further increase the magnetizing current density, silver wire may be used in place of copper wire. Driving core/pick-up core coupling coefficient effects are further described in copending Logue patent serial no. 08/832,100. There is a first pair of excitation coils 158A–158B wound on the sine axis and a second pair of excitation coils 158C–158D wound on the cosine axis (only one coil 158A having leads 158L is shown for clarity). Each excitation winding covers a quadrant of the toroid circumference for uniform flux distribution. The first pair of excitation coils may be connected in series (preferred) or parallel, the second pair being connected likewise. FIG. 2A shows series connected sine-cosine excitation coils. In essence there are two parallel sine fields and two parallel cosine fields connected in a circular toroid 55, resulting in a rotating magnetic dipole as in the cited Tesla Patents. The poly-phase winding structure of driving core 55, 155A, 155B, is not limited to two phases but may be 3, 4, 5, 6. . . . . phases, excited by a corresponding plurality of excitation generators. The winding distributions and connecting leads like-wise would be increased in number.

Figure 1A:
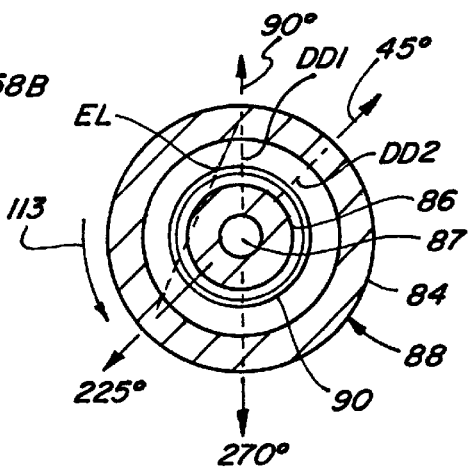
FIG. 1A, is a radial top view of the pick-up core shown in FIG. 1, vectorially illustrating the flux paths involved.

Pick-up core 188 is snug fit partially within the window 181 of driving toroid 155, a diameter-wised driving dipole DD in FIG. 1A is coupling the outer cylindrical pole 184 (workpiece coupler).

The described toroid cores (including stacked versions) are now the preferred driving core designs for the proximity sensor of Logue patent no. 5,404,101 and the polar coordinates joystick in Logue patent no. 5,559,432.

The annular extending portion of pick-up core 188 is snug fit with a thick copper washer (in earlier Logue patents called a magnetic shield) now called a Torsional Lenz Refelector (TLR). Copper washer TLR presents a torsional load pulling the annular sensing face portion 106 of pick-up core 188 behind the phase angle of the driven base portion 185 forming a flux helix 111 having few angular degrees (shown in FIG. 1 as a lagging phase angle 111). In like manner a Lenz reflection results in a phase shifting effect across a magnetic pole structure in the shaded pole motor stator. Two rotating magnetic dipoles may be seen in pick-up core 188, a first at the base portion 185 and a second at the sensing face 106. The magnetic torsional effect of TLR is phase constant as long as the sine-cosine excitation frequency is constant. However any change from a pure sine wave causes the H magnetizing factor to encounter the "inertia" (a mechanical analogy) of the torsional Lenz reflector TLR, effecting a corresponding phase shift between the top and bottom of pick-up core 88, 188, 288.

Figure 3:
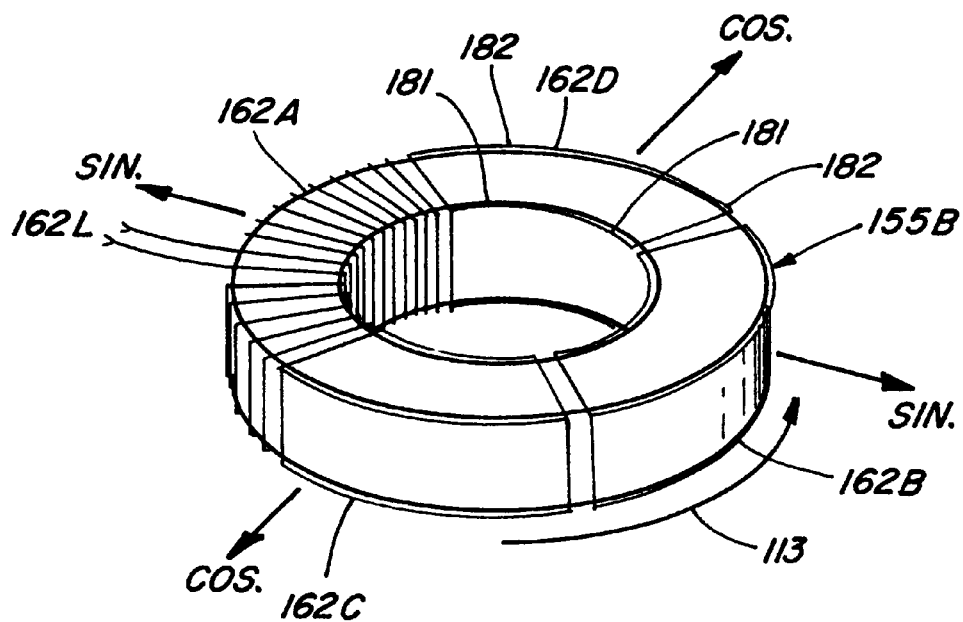

An excitation mode such as the rotating elliptical sensing pattern (Logue patent no. 5,793,204) dynamically changes the flux helix 111 angle as the precessing ellipse is drawn in time due again to the magnetic inertia presented by TLR (more properly TLR1). Further, a conducting workpiece such as aluminum becomes a second Torsional Lenz Reflector (TLR2) affecting flux helicity 111. Still further, Torsional Lenz Reflectors TLR1, TLR2 are considered to be passive elements as are deeper layers (TLR3, TLR4) in multi-layer nonferrous workpieces (such as aircraft structures). Although TLR2, TLR3, TLR4, are remote eddy current reflections they add to the degree of helicity in pick-up core 88, 188, 288, (also applicable to the integral sensor/driver embodiments), and the resultant shortened effective flux return path. FIGS. 2, 3, are perspective views of two toroid driving cores 155A, 155B, illustrating a fixed angular orientation between toroids. Driving toroid 155A is single layer wound with a pair of cosine distribution windings 158A, 158B, and a pair of sine distribution windings 158C, 158D, (only winding 158A, with connecting leads 158L is drawn). In the preferred embodiment coil distribution is offset by 90 degrees so that 158A, 158B can be referred to as the cosine coil pair and 158C, 158D can be referred as the sine coil pair. Driving toroid 155A has an inside diameter (window) 181, and an outside diameter 182. The relative field direction is arrow 113. Referring now to FIG. 1A to analyze the significance of the phase difference (flux helix) between the top and bottom of pick-up core 188, in FIG. 1 (helical curve 111).

FIG. 1A is a radial sensing end view of pick-up core 88, 188, 288, comprising an outer (cylindrical) pole 84, a central pole 86, with a bore 87. A pick-up coil 90, is wound around central pole 86 for generating a polar coordinates signal (fully described in the cited Logue patents).

Figure 5:
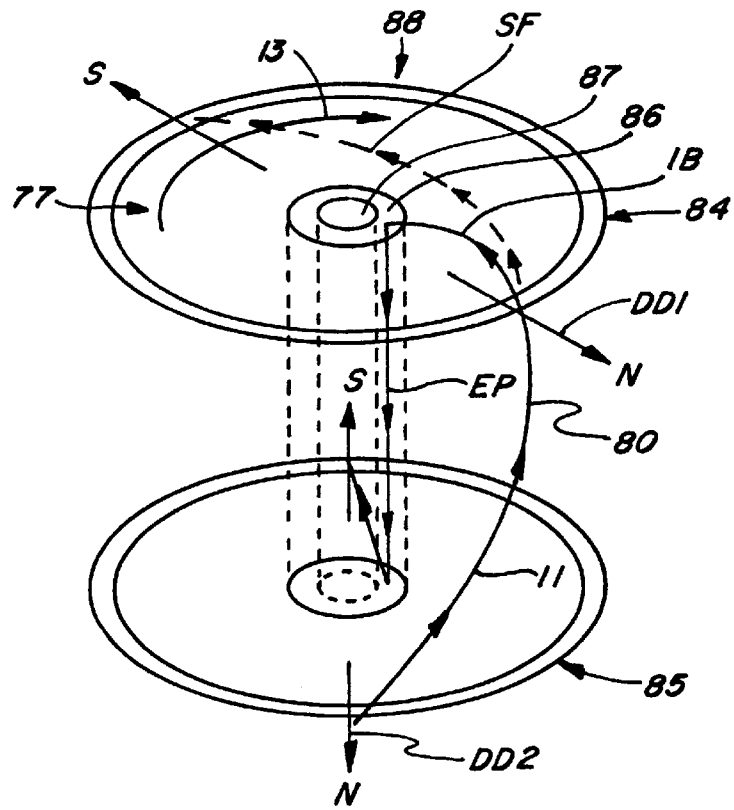
FIG. 5, is a isometric diagram of the effective flux circuit in the pick-up core of a polar sensor illustrating a helical structure.

Vector DD1 represents a first rotating field (driving dipole) generated by driving toroid 155B coupling around the base portion 285 of pick-up core 288. Vector DD2 represents a second rotating field generated by driving toroid 155A coupling around the sensing end 284A of pick-up core 288. Driving field direction is represented by arrow 113. Vectors DD1 and DD2 are connected by a flux helix 111 as in FIG. 1. Vector DD2 at the sensing end of pick-up core 88 is shown having an examplary 45 degree phase lag behind vector DD1 at the base end (not shown). FIG. 5, diagrammatically maps out in simplified form the effective path EP (flux path) in a polar sensor pick-up core 88 (applicable also to the integral sensor/driver embodiment), also illustrating effective length. Circle 84 in FIG. 5 represents the outer pole 84, 184, 284 of a polar sensor, the emphasis being on the annular sensing face. Circle 85 represents the base portion 185, 285. Now, tracing effective flux path EP, the driving flux (solid line 80) generated by toroidal driving core 55, 155, 155A, 155B, originate at the base portion 85, 185, flow in the cylindrical outer pole 84, (longitudinal length not shown in FIG. 5) progress to the annular sensing face 77. The helical 77 shape of the flux structure up the longitudinal length of pick-up core 88, 188, becoming driving dipole DD1 (the sensing dipole).

This helical shape is a result of a torsional phase difference in the coplanar (in reference to the planes of circles 84, 85) driving flux. The sensing flux SF (dashed line) being the majority of the generated field flows through the workpiece (not shown). Continuing, the unbalanced portion IB of the sensing field is attracted to the central pole 86, flowing down to the base portion 85, 185, across the base radius to the S end driving dipole DD2. Due to the approx. 45 degree phase difference between driving dipoles DD1, DD2, the return effective path of unbalance flux is asymmetric as seen in FIGS. 1A, 5. If there were no phase difference between driving dipoles DD1, DD2, the effective path EP would be a simple diameter-wise length. The effective path is believed to be eccentric to the axis (bore 87) of the central pole 86, shortening the effective length EL (mean path) as shown in FIG. 1A. The exact degree of helicity depends not only on the phasing of stacked toroid driving cores but (as mentioned) also on the torsional Lenz reflection of a conducting workpiece such as aluminum. This reflected torsion load may be additive or subtractive depending on the "flux helix" angle as related to driving field direction. If the driving toroid disposed at the sensing face is lagging in phase (relative to the driving toroid disposed at the base portion 85, 185) then the eddy currents induced in a conductive workpiece add to the flux helix angle and make the said effective length even shorter. Thus a leading phase flux helix has opposite effects on the effective flux length.

Figure 4:
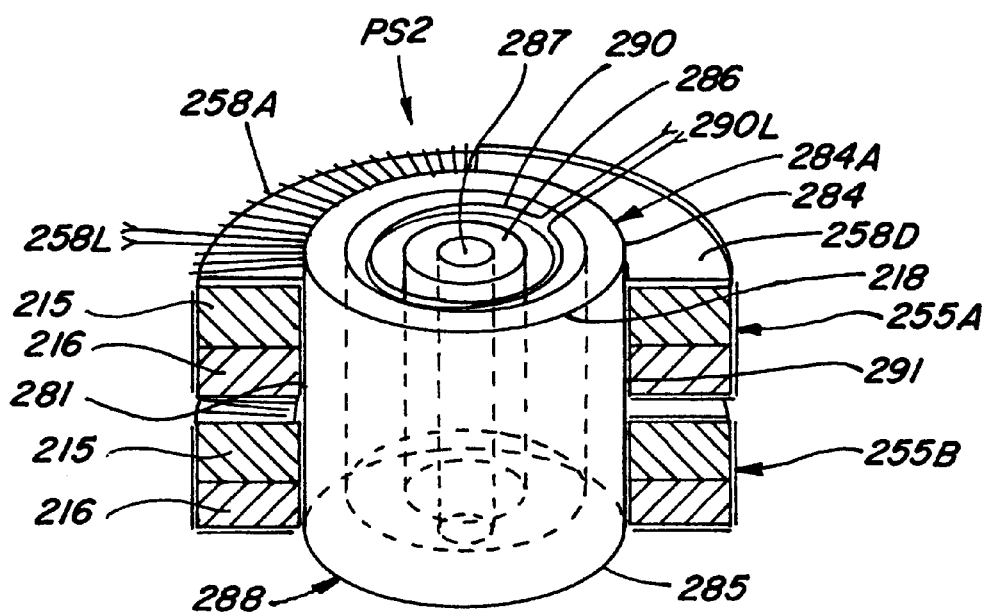
FIG. 4 is an isometric view of the second embodinent of the invention i.e. a stacked toroid version driving core polar sensor.

FIG. 4, is an isometric view of the second embodiment of the invention, polar sensor PS2. A pair of driving toroids 255A, 255B, provide the capability of fixed and or dynamic adjustment of flux helicity in the outer pole 284 of the pick-up core 288. The fixed method is illustrated in the angular relation between FIGS. 2, 3. The dynamic method being a digital computer providing individual phase control of two poly-phase excitation generators. Selected software provides full 360 degree phase shift.

A combination of circular excitation may applied to one driving toroid and at the same time elliptical excitation (patent 5,793,204) applied to the second driving toroid for a beat effect in the sensing pattern. Pick-up core 288 is driven by two single layer wound driving toroids 255A, 255B. Pick-up core 288 is a high permeability ferrite pot core half having an extended longitudinal length 291 (approx. three times longer than conventional) is snug mounted partially within toroid windiw 281. The extended longitudinal length 291 provides a mutual longitudinal coupling to driving toroids 255A, 255B.

A copper end cap (not shown) may be tightly fit around the extending portion 284A, to double as a Torsional Lenz Reflector.

Figure 6:
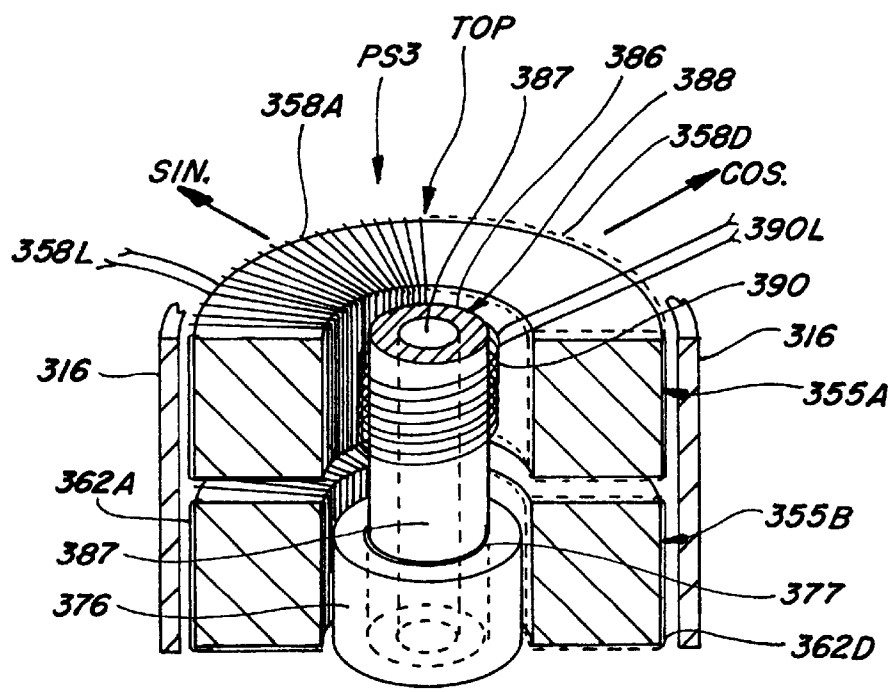
FIG. 6, is an isometric view of the third embodiment of the invention, an integral sensor/driver utilizing stacked toroid cores.

FIG. 6, is an isometric view of the third embodiment of the present invention, an integral sensor/driver PS3, utilizing a stack of two single layer wound toroid cores 355A, 355B formed of a high permeability magnetic material. The stacked driving toroids 355A, 355B form what may be called a magnetic annulus.

The "workpiece coupler" of PS3 that magnetically couples with the workpiece is actually a flat side 352 of driving toroid 355A (top in FIG. 6). Four single layer sine-cosine excitation windings (only two 358A, 358D are shown for driving toroid 355A) and two for 355B (362A, 362D). Multi-layer excitation windings may also be used for a greater range of impedance matching. It should be understood the total number of driving toroids forming the stack can be a plurality greater than 2 (the pick-up core 388, being proportionally longer). The angular phase difference between stacked toroids has the added advantage of generating a more uniform sensing pattern resulting in more perfect signal nulling. Sensor PS3 may be potted in an aluminum cylindrical case 316 with a thin layer of potting compound (not shown) covering the annular sensing end 352. The pick-up elements comprise a central pole 386 formed of a high permeability magnetic material (a ferrite bead). There is a hole or bore 384 extending concentrically through the length of 386.

Bore 384 is believed to enhance shortening of the effective flux length as diagrammatically shown in FIG. 5. Disposed concentrically around central pole 388 is a ferrite coupling collar 376 (a short ferrite bead or slug) longitudinally disposed within driving toroid 355B for a flux return path. The concentric magnetic gap between coupling collar 376 and the window of driving core 355B provides a coupling coefficient advantage allowing the generation of harmonic signals in pick-up coil 390.

This shortened flux return path may be further enhanced by increasing the diameter of central pole 386 and bore 384, relative to the outer pole 386. This increased diameter central pole 386 and bore 384 may be of particular advantage in a polar proximity sensor (parent patent no. 5,404,101).

A pick-up coil 390 of many turns (1292 ohms) of 44 ga. magnet wire is around central pole 388 having leads 390L. Pick-up coil 390 may be tuned to resonance (a tank circuit) by connecting a capacitor/s across leads 390L. A multi-position selector switch (not shown) may be mounted in the rear end of sensor case 316 (partially shown in FIG. 6) to change this capacitance value. FIG. 7 is a cut-away isometric view of polar sensor (eddy current probe) PS4, combining the integral sensing/driving core idea of FIG. 6 with the composite toroid driving core idea of FIG. 1. The degree of flux helicity in probe PS4, is determined primarily by the respective hysteresis loops of the two magnetic materials 415, 416. Secondly, the inherent additive torsional Lenz reflections e.g. a layered aluminum workpiece. FIG. 8, is an isometric fragmentary view of a composite toroid core C55, showing how different hysteresis loops affect the angular magnetization point. Composite toroid C55 is formed of two magnetic materials 15, 16, bonded together (boundary C44). Sine-cosine winding distributions (only one 58D, is shown) supply the magnetizing field H. Magnetic induction B progress around the toroid circumference in the direction indicated by arrow 13 (cw). Magnetic material 16 has a square hysteresis loop SHL and magnetic material 15 has a rounded hysteresis loop RHL. Neglecting boundary effects at C44, SHL should attain a given level of magnetic induction B a few degrees ahead (phase difference PD) of RHL.

There are further variations of toroidal driving cores (also adapatable to integral sensor/driver embodiments) comprising a toroid core having toothed segments with the sine-cosine excitation windings wound between the segments. Firstly, the segments may be formed on the inner diameter of the toroid window as conventional induction motor designs. Secondly, segments may be formed on the sides of the driving toroid with poly-phase excitation wound between projecting segments, providing better coupling to the workpiece.

The several theories of operation presented in this disclosure are based on elementary experimentation, it is not intended that the inventor, or invention in any way be restricted by these explanations or theories.

I claim:

1. A polar coordinates sensor driven by a poly-phase stator core for generating a polar coordinates signal, the combination comprising:
   a) a polar coordinates sensor including a high permeability pot core half concentrically inclosing a pick-up coil, the pot core half having the form of an outer cylindrical pole concentrically disposed around a cylindrical central pole leaving an annular pick-up coil space, the central and outer poles joined at one end by an annular base portion, the pick-up coil being wound concentrically around the central pole and having signal leads, the end opposite the base portion forming an annular sensing face portion;
   b) a toroidal stator having a toroid window, said stator formed of a high permeability material, and wound with poly-phase winding distributions;
      i) poly-phase excitation being applied to the winding distributions for inducing a rotating driving vector diameter-wise across the toroid window and a fringing hemispherical flux from the stator plane;
   c) the said polar coordinates sensor being mounted concentrically within the toroid window for coupling the, driving vector to the pot core half, and for coupling a fringing hemispherical flux from the annular sensing face to a workpiece, the driving vector further coupling a magnetic flux coplanar to the pick-up coil turns for an inherent signal null.

2. The toroidal stator in claim 1, further comprising an internally segmented toroid with poly-phase excitation winding distributions wound around pole segments extending radi inward from the toroid core window.

3. The toroidal stator in claim 1, further comprising a toroid wound around the outside with poly-phase excitation winding distributions.

4. A polar coordinates sensor having increased flux helicity in the pick-up core comprising:
   a) a polar coordinates sensor including a high permeability pot core half concentrically inclosing a pick-up coil, the pot core half having the form of an outer cylindrical pole concentrically disposed around a cylindrical central pole leaving an annular pick-up coil space, the central and outer poles joined at one end by an annular base portion, the pick-up coil being wound concentrically around the central pole and having signal leads, the end opposite the base portion forming an annular sensing face portion;

b) a driving toroid having a toroid window, said toroid formed of a high permeability material, and wound with poly-phase winding distributions;
   i) poly-phase excitation being applied to the winding distributions for inducing a rotating driving dipole diameter-wise across the toroid window;

c) the said polar coordinates sensor being mounted concentrically within the winding window for coupling the driving dipole to the pot core half, and for coupling a fringing hemispherical flux from both the annular sensing face and a planar side of the driving toroid to a workpiece for increased eddy current induction, the driving dipole further coupling a magnetic flux coplanar to the pick-up coil turns for an inherent signal null.

5. The sensor of claim 4 wherein the said driving toroid is compositely formed of first and second stacked sub-toroids having respectively different hysteresis loops for generating a longitudinal magnetization phase angle difference between sub-toroids for producing a flux helix in the stack.

6. A polar coordinates sensor having increased flux helicity in the pick-up core utilizing coaxially stacked driving toroids comprising:

a) a polar coordinates sensor including a high permeability pot core half concentrically inclosing a pick-up coil, the pot core half having the form of an outer cylindrical pole concentrically disposed around a cylindrical central pole leaving an annular pick-up coil space, the central and outer poles joined at one end by an annular base portion, the pick-up coil being wound concentrically around the central pole and having signal leads, the end opposite the base portion forming an annular sensing face portion;

b) a stack of first and second driving toroids for generating respective first and second driving dipoles forming coaxially stacked toroid windows;
   i) each said driving toroid being formed of a high permeability material, and wound with poly-phase winding distributions;

c) poly-phase excitation being applied to the winding distributions for inducing a rotating driving dipole diameter-wise across the toroid window;

c) the said polar coordinates sensor being mounted concentrically within the coaxially stacked toroid windows for coupling the said first and second driving dipoles to the pat core half by means of first and second driving toroids being disposed concentrically around the annular sensing end and base portion respectively, and;
   i) for coupling a fringing hemispherical flux from both the annular sensing face and a planar side of the first driving toroid to a workpiece for more direct eddy current induction;
   ii) the driving dipoles insdide the coaxially stacked toroid windows further coupling a magnetic flux coplanar to the pick-up coil turns for an inherent signal null.

7. The sensor in claim 6, wherein the spatial angle of poly-phase excitation winding distributions of the first and second stacked driving toroids has a predetermined phase displacement for inducing a flux helix longitudinally of the stacked toroid windows.

8. The sensor in claim 7, wherein the said predetermined phase displacement is generated by dynamically shifting the phase angle of the poly-phase excitation applied to the excitation winding distributions of the first and second driving toroids for adjusting the flux helix angle over both a positive and negative range.

* * * * *